US012590173B2

(12) United States Patent
Higuchi et al.

(10) Patent No.: US 12,590,173 B2
(45) Date of Patent: Mar. 31, 2026

(54) COMPOSITION, PATTERN FORMING METHOD, SEMICONDUCTOR DEVICE, AND METHOD FOR MANUFACTURING SEMICONDUCTOR DEVICE

(71) Applicant: Kioxia Corporation, Tokyo (JP)

(72) Inventors: Takeshi Higuchi, Yokohama Kanagawa (JP); Takahiro Iwasaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 849 days.

(21) Appl. No.: 17/684,698

(22) Filed: Mar. 2, 2022

(65) Prior Publication Data

US 2023/0104730 A1 Apr. 6, 2023

(30) Foreign Application Priority Data

Sep. 21, 2021 (JP) ................................ 2021-153336

(51) Int. Cl.
*C08F 30/08* (2006.01)
*C08F 28/02* (2006.01)
(Continued)

(52) U.S. Cl.
CPC .............. *C08F 30/08* (2013.01); *C08F 28/02* (2013.01); *C08F 216/1466* (2013.01); *C08F 216/1475* (2020.02); *C08F 216/1483* (2020.02); *C08F 216/1491* (2020.02); *C08F 220/38* (2013.01); *C08F 220/382* (2020.02);
(Continued)

(58) Field of Classification Search
CPC .... C08F 30/08; C08F 230/08; C08F 230/085; C08F 222/102; C08F 222/24; C08F 222/245; C08F 216/02; C08F 216/04; C08F 216/06; C08F 216/08; C08F 216/085; C08F 216/1466; C08F 216/1475; C08F 216/1483; C08F 216/1491; C08F 220/38; C08F 220/382; C08F 220/385; C08F 220/387;
(Continued)

(56) References Cited

U.S. PATENT DOCUMENTS 4,604,342 A * 8/1986 Sondergeld ............ G03F 7/027 522/119
10,147,612 B2 12/2018 Nakanishi et al.
2005/0263025 A1 12/2005 Blees

FOREIGN PATENT DOCUMENTS

CN 110452387 A * 11/2019 .......... C08G 77/392
JP 2005534190 A 11/2005

(Continued)

*Primary Examiner* — Joseph S Del Sole
*Assistant Examiner* — David L Miller
(74) *Attorney, Agent, or Firm* — Holtz, Holtz & Volek PC

(57) ABSTRACT

According to one embodiment, a composition including a compound is provided. The compound includes a linking group containing 2 to 18 carbon atoms, a polymerizable functional group bonded to the linking group, a first reactive group bonded to the linking group, and a second reactive group bonded to the linking group. The polymerizable functional group includes at least one of a (meth)acryloyl group or a vinyl group. The first reactive group includes at least one selected from the group consisting of a thiol group, a disulfide group, and a thiocyanate group. The second reactive group includes at least one selected from the group consisting of an alkoxysilane group, a chlorosilane group, and a hydroxyl group.

20 Claims, 6 Drawing Sheets

(51) Int. Cl.

| | |
|---|---|
| ***C08F 216/14*** | (2006.01) |
| ***C08F 220/38*** | (2006.01) |
| ***C08F 222/24*** | (2006.01) |
| ***C08F 228/02*** | (2006.01) |
| ***C08F 230/08*** | (2006.01) |
| ***G03F 7/00*** | (2006.01) |
| ***H01L 21/768*** | (2006.01) |
| ***H01L 23/532*** | (2006.01) |
| *C08F 128/02* | (2006.01) |
| *C08F 212/14* | (2006.01) |
| *C08F 216/02* | (2006.01) |
| *C08F 216/04* | (2006.01) |
| *C08F 216/06* | (2006.01) |
| *C08F 216/08* | (2006.01) |
| *C08F 220/28* | (2006.01) |
| *C08F 222/10* | (2006.01) |

(52) U.S. Cl.

CPC ........ *C08F 220/385* (2020.02); *C08F 222/24* (2013.01); *C08F 222/245* (2020.02); *C08F 228/02* (2013.01); *C08F 230/08* (2013.01); *G03F 7/0002* (2013.01); *H01L 21/76817* (2013.01); *H01L 21/76877* (2013.01); *H01L 23/53295* (2013.01); *C08F 128/02* (2013.01); *C08F 212/30* (2020.02); *C08F 216/02* (2013.01); *C08F 216/04* (2013.01); *C08F 216/06* (2013.01); *C08F 216/08* (2013.01); *C08F 216/085* (2020.02); *C08F 220/287* (2020.02); *C08F 222/102* (2020.02)

(58) Field of Classification Search

CPC ...... C08F 21/30; C08F 228/02; C08F 128/02; C08F 28/02

See application file for complete search history.

(56) References Cited

FOREIGN PATENT DOCUMENTS

| | | | |
|---|---|---|---|
| JP | 2016115921 | A | 6/2016 |
| JP | 2018160536 | A | 10/2018 |

* cited by examiner

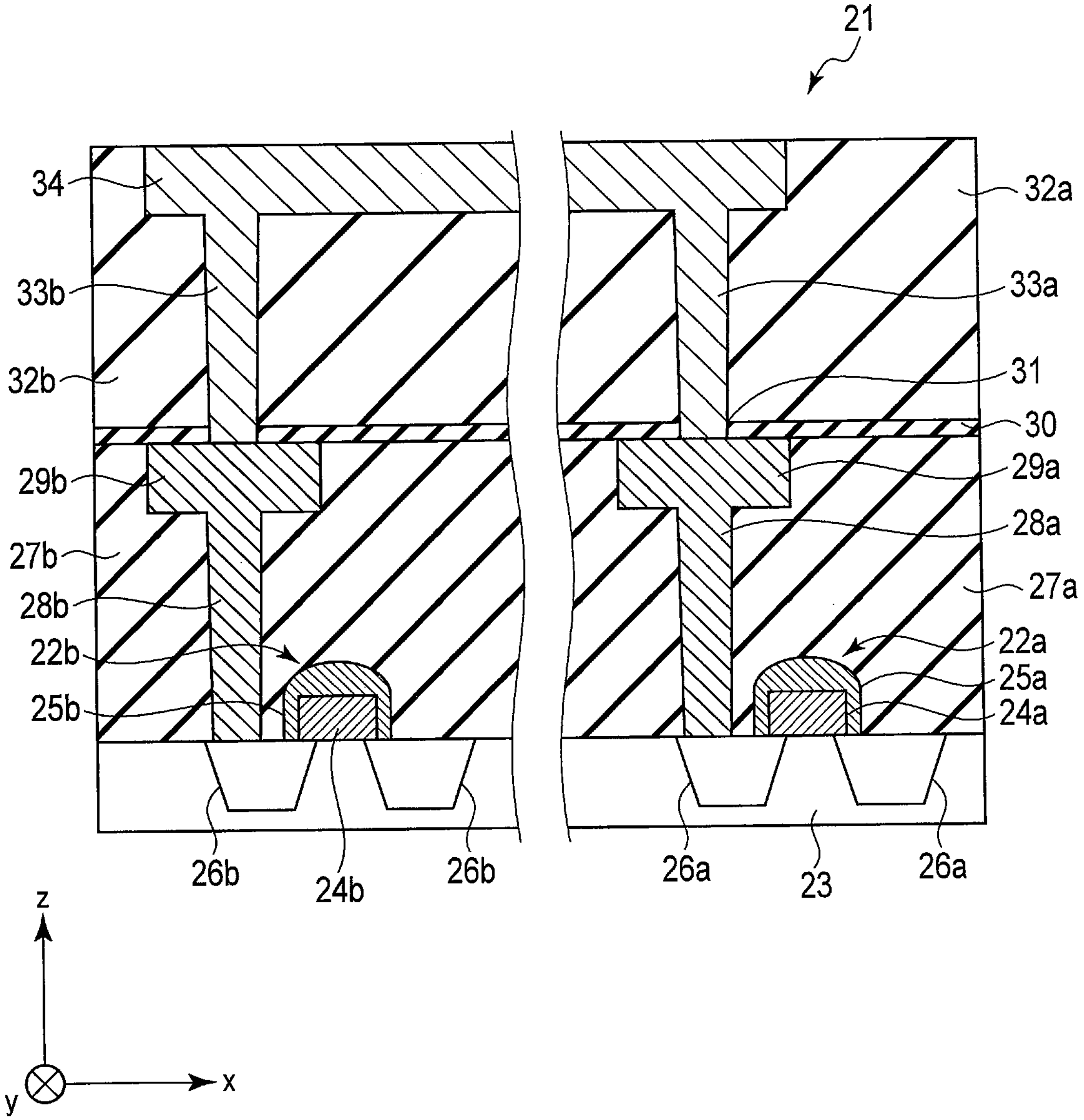
F I G. 11

COMPOSITION, PATTERN FORMING METHOD, SEMICONDUCTOR DEVICE, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2021-153336, filed Sep. 21, 2021, the entire contents of which are incorporated herein by reference.

FIELD

Embodiments described herein relate generally to a composition, a pattern forming method, a semiconductor device, and a method for manufacturing a semiconductor device.

BACKGROUND

In recent years, a dual damascene method has attracted attention in which a conductive film is also embedded in a coupling hole that provides conduction between an upper layer interconnect and a lower layer interconnect when embedding interconnects in an interlayer insulating film, thereby enabling simultaneous formation of an interconnect section and a plug section with a single conductive film.

BRIEF DESCRIPTION OF THE DRAWINGS

FIG. 11 is a schematic view showing another example of the semiconductor device according to the embodiment.

DETAILED DESCRIPTION

Figure 1:
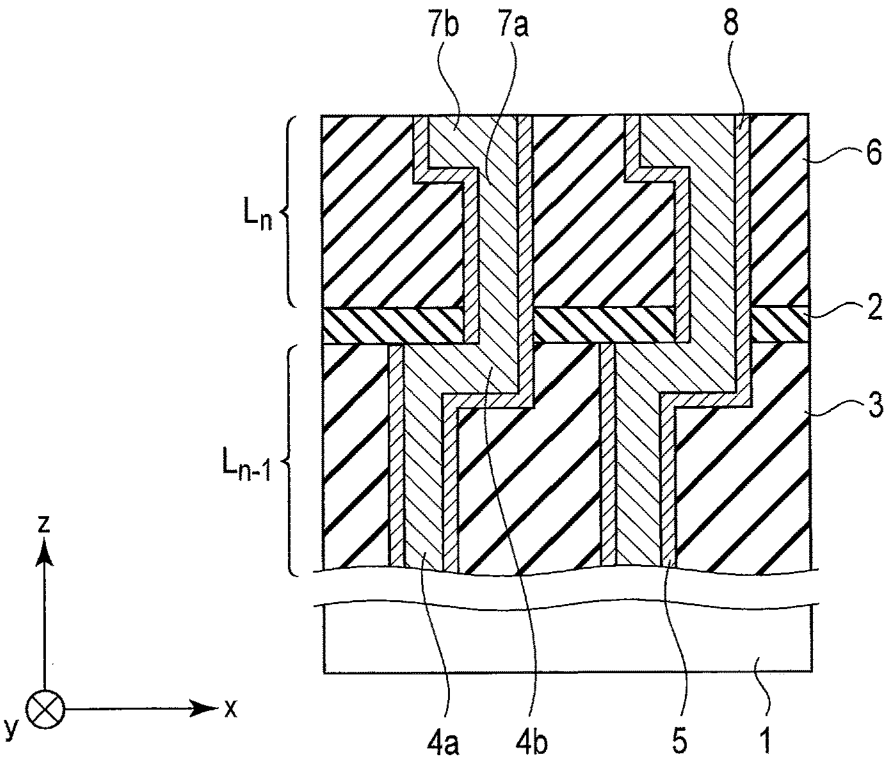
FIG. 1 is a schematic view showing a cross-sectional structure of an example of a semiconductor device according to one embodiment.

In general, according to one embodiment, a composition includes a compound. The compound includes a linking group containing 2 to 18 carbon atoms, a polymerizable functional group bonded to the linking group, a first reactive group bonded to the linking group, and a second reactive group bonded to the linking group. The polymerizable functional group includes at least one of a (meth)acryloyl group or a vinyl group. The first reactive group includes at least one selected from the group consisting of a thiol group, a disulfide group, and a thiocyanate group. The second reactive group includes at least one selected from the group consisting of an alkoxysilane group, a chlorosilane group, and a hydroxyl group.

Hereinafter, embodiments will be described with reference to the accompanying drawings. In the following description, components with substantially the same functions and configurations will be referred to with the same reference numerals, and repeated descriptions may be omitted. The figures are schematic, meaning the relations between the thickness and the dimensions of a plane, and the ratio of the thicknesses of layers may differ from actual ones. Moreover, the figures may include components which differ in relations and/or ratios of dimensions between the figures. The entire description of an embodiment is applicable to another embodiment unless otherwise expressly or implicitly excluded. Each embodiment illustrates a device and method for materializing the technical idea of each embodiment, which does not specify the material, shape, structure, arrangement, and the like of components to those described below.

First Embodiment

According to a first embodiment, a composition including a compound is provided.

The compound of the embodiment will be described.

The linking group may be, for example, a group of an organic compound containing 2 to 18 carbon atoms. With a carbon number of 2 to 18, the compound can take a solid form at an ambient temperature instead of a liquid form. Examples of the group of an organic compound include groups of hydrocarbon compounds, such as an alkyl group, and groups of aromatic compounds.

The polymerizable functional group is capable of forming a covalent bond through photoradical reaction. As an example, the polymerizable functional group is a polymerizable functional group capable of forming a covalent bond with a photo-curable resin through radical reaction. The details of the photo-curable resin will be described later. The radical reaction may be caused by, for example, a radical generated from a component included in the composition through light irradiation. The component is, for example, a photopolymerization initiator. Examples of the polymerizable functional group include a polymerizable functional group that includes at least one of a (meth)acryloyl group or a vinyl group.

The first reactive group is capable of forming a covalent bond with a metal atom. For example, metal may be included in a surface of a substrate with which the composition including the compound of the embodiment is to be in contact. Examples of the metal include copper (Cu), aluminum (Al), and tungsten (W). One or two or more types of metal may be included. Examples of the first reactive group include those that include at least one selected from the group consisting of a thiol group, a disulfide group, and a thiocyanate group.

The second reactive group is capable of forming a covalent bond with a compound including Si and O through hydrolysis or dehydration reaction. For example, the compound including Si and O may be contained in a surface of a substrate with which the composition including the compound is to be in contact. Examples of the compound including Si and O include organic compounds, inorganic compounds, organic-inorganic hybrid compounds. Examples of the reaction for forming a covalent bond with a compound including Si and O through hydrolysis or dehydration reaction include silane coupling reaction. Examples of the second reactive group include those that contain at least one selected from the group consisting of an alkoxysilane group, a chlorosilane group, and a hydroxyl group.

The substrate with which the composition including the compound is to be in contact is not particularly limited as long as it has, for example, a surface including a portion containing the compound including Si and O and a metal-containing portion. The substrate may be configured so that the entire surface is formed of said surface or at least a part of the surface is formed of said surface. The surface may be positioned on the upper side of the substrate. A specific example thereof is an interconnect layer of a semiconductor device. Hereinafter, the substrate with which the composition including the compound of the embodiment is to be in contact may be referred to as a “processing target”.

Examples of the compound are represented by a chemical formula 1 and a chemical formula 2 below. The compound may include a first compound having a structure represented by the chemical formula 1 or a second compound having a structure represented by the chemical formula 2, or both the first compound and the second compound.

[Chemical Formula 1]

(1)

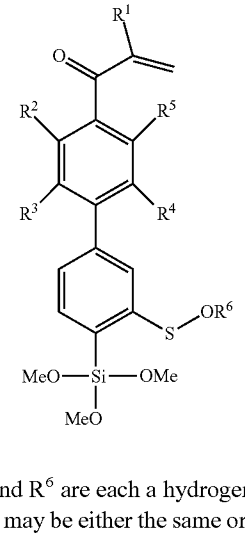

wherein $R^1$ and $R^6$ are each a hydrogen atom or a methyl group, and may be either the same or different; $R^2$ to $R^5$ are each selected from the group consisting of a hydrogen atom, a fluorine atom, a chlorine atom, a bromine atom, and an iodine atom; $R^2$ to $R^5$ may be either the same or different; and Me is a methyl group.

The first compound includes a (meth)acryloyl group as the polymerizable functional group, a thiol group as the first reactive group, and an alkoxysilane group as the second reactive group. The carbon number of the linking group satisfies the range of 2 to 18.

[Chemical Formula 2]

(2)

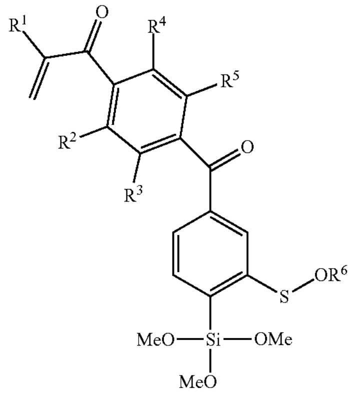

wherein $R^1$ and $R^6$ are each a hydrogen atom or a methyl group, and may be either the same or different; $R^2$ to $R^5$ are each selected from the group consisting of a hydrogen atom, a fluorine atom, a chlorine atom, a bromine atom, and an iodine atom; $R^2$ to $R^5$ may be either the same or different; and Me is a methyl group.

The second compound includes a (meth)acryloyl group as the polymerizable functional group, a thiol group as the first reactive group, and an alkoxysilane group as the second reactive group. The carbon number of the linking group satisfies the range of 2 to 18.

The compound of the embodiment can be synthesized by, for example, the Suzuki-Miyaura coupling method. An example of the Suzuki-Miyaura coupling method is a method in which an organic boron compound and an aryl halide are cross-coupled to each other through the action of a nucleophile.

The content of the compound of the embodiment in the composition is preferably 40% by mass or more. However, when the composition includes a solvent, the total amount of the components excluding the solvent is 100% by mass.

The compound of the embodiment may exist in the form of a monomer, an oligomer, or a polymer in the composition. For example, multiple forms of the compound, such as a monomer of the compound and an oligomer of the compound, may exist in the composition.

The compound in the composition can be identified according to, for example, electrospray ionization-time of flight mass spectrometry (ESI-TOFMS) and a nuclear magnetic resonance (NMR) method. Specifically, a mass spectrometry spectrum (MS spectrum) is obtained according to the ESI-TOFMS, and a molecular weight calculated from the MS spectrum and a molecular weight of a fragment as well as the chemical shift of the NMR spectrum are analyzed, whereby inclusion or otherwise of the compound in the composition can be determined.

The composition may include a photo-curable resin. The photo-curable resin is a resin which is curable through light irradiation. An example of the photo-curable resin is a resin that includes at least a polymerizable compound and a photopolymerization initiator.

The polymerizable compound is not particularly limited, and may be an organic compound or an inorganic-organic hybrid compound. The polymerizable compound is preferably a compound that imparts viscosity so that the composition may form a film. The polymerizable compound may be, for example, a resin having a viscosity of 500 mPa·s or less. Examples of the polymerizable compound include a monomer containing Si and a polymer containing Si. Specific examples of the polymerizable compound include a silsesquioxane-containing polymer and a polymer containing a derivative thereof. One or two or more types of polymerizable compounds may be used. The compound of the embodiment included in the composition may also serve as the polymerizable compound.

The photopolymerization initiator is not particularly limited provided it generates radicals with light irradiation; however, one that generates radicals with radiation of light having the wavelength used for curing is preferred. The wavelength of the light used for curing is, for example, in a range of 355 nm to 500 nm. A preferred wavelength range is 365 nm to 430 nm from a practical point of view. Examples of the photopolymerization initiator include photoradical polymerization initiators such as acylphosphine oxide-based compounds, alkylphenone-based compounds, and acylphosphine oxide-based compounds. An example of the acylphosphine oxide-based compounds is Irgacure (registered trademark) 819. An example of the alkylphenone-based compounds is Irgacure (registered trademark) 184. On the other hand, an example of the acylphosphine oxide-based compounds is Irgacure (registered trademark) TPO. One, two or more types of photopolymerization initiators may be used.

The content of the photopolymerization initiator in the composition may be in a range of 0.01% by mass to 15% by mass. However, when the composition includes a solvent, the total weight of the components excluding the solvent is 100% by mass. When the content of the photopolymerization initiator is 0.01% by mass or more, the sensitivity (rapid curability) and the strength of the coating film tend to further improve. The content of the photopolymerization initiator is preferably in a range of 0.1% by mass to 10% by mass, more preferably in a range of 0.5% by mass to 7% by mass, and most preferably in a range of 1% by mass to 5% by mass. When two or more types of photopolymerization initiator are used, the total amount thereof is the amount of the photopolymerization initiator. The composition may further include a non-polymerizable compound or a solvent, or both a non-polymerizable compound and a solvent, as necessary. The non-polymerizable compound may include at least one selected from the group consisting of a sensitizer, a hydrogen donor, an internal mold release agent, a surfactant, an antioxidant, a polymer component, and a polymerization inhibitor.

For example, the solvent has at least one functional group selected from the group consisting of an ester group, a carbonyl group, a hydroxyl group, and an ether group. Examples of the solvent include 1-methoxy-2-propyl acetate (propylene glycol monomethyl ether acetate (PGMEA)), 1-methoxy-2-propyl acetate, ethoxyethyl propionate, cyclohexanone, 2-heptanone, γ-butyrolactone, butyl acetate, propylene glycol monomethyl ether, ethyl lactate, and 4-methyl-2-pentanol. Among these, PGMEA, γ-butyrolactone, cyclohexanone and 4-methyl-2-pentanol are preferred. A more preferred solvent is one that includes at least PGMEA. One, two or more types of solvents may be used. The content of the solvent in the composition may be 90% by mass or more, preferably 98.0% by mass or more, and more preferably 99.0% by mass or more. The content of the solvent in the composition may also be 99.999% by mass or less. When two or more types of solvent are included in the composition, the total amount of the solvent preferably satisfies the above range.

The composition may also include a modifier such as a blending compound or other polymers. The modifier has the role of improving film formation of the composition by spin coating and embedding of the composition in a stepped substrate (including a stepped processing target). Examples of such a modifier include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluorene-9-ylidene)bisphenol, 2,2'-dimethyl-4,4'-(9H-fluorene-9-ylidene)bisphenol, 2,2'-diallyl-4,4'-(9H-fluorene-9-ylidene) bisphenol, 2,2'-difluoro-4,4'-(9H-fluorene-9-ylidene) bisphenol, 2,2'-diphenyl-4,4'-(9H-fluorene-9-ylidene) bisphenol, 2,2'-dimethoxy-4,4'-(9H-fluorene-9-ylidene) bisphenol, 2,3,2',3'-tetrahydro-(1,1')-spirobiinden-6,6'-diol, 3,3,3',3'-tetramethyl-2,3,2',3'-tetrahydro-(1,1')-spirobiinden-6,6'-diol, 3,3,3',3',4,4'-hexamethyl-2,3,2',3'-tetrahydro-(1,1')-spirobiinden-6,6'-diol, 2,3,2',3'-tetrahydro-(1,1')-spirobiinden-5,5'-diol, 5,5'-dimethyl-3,3,3',3'-tetramethyl-2,3,2',3'-tetrahydro-(1,1')-spirobiinden-6,6'-diol, 1-naphthol, 2-naphthol, 2-methyl-1-naphthol, 4-methoxy-1-naphthol, 7-methoxy-2-naphthol, 1,5-dihydroxynaphthalene, 1,7-dihydroxynaphthalene, 2,6-dihydroxynaphthalene, and other dihydroxynaphthalenes, 3-hydroxynaphthalene-2-methyl carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, and other novolak resins, polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, poly(meth)acrylate, and copolymers thereof. One, two or more types of modifiers may be used.

The composition of the embodiment described above includes a compound. The compound includes a linking group containing 2 to 18 carbon atoms, a polymerizable functional group bonded to the linking group, a first reactive group bonded to the linking group, and a second reactive group bonded to the linking group. The polymerizable functional group includes at least one of a (meth)acryloyl group or a vinyl group. The first reactive group includes at least one selected from the group consisting of a thiol group, a disulfide group, and a thiocyanate group. The second reactive group includes at least one selected from the group consisting of an alkoxysilane group, a chlorosilane group, and a hydroxyl group. Such a composition may be cured by light irradiation while the first reactive group and the second reactive group of the compound bind to the surface containing the compound including Si and O and metal. As a result, a light-cured composition achieving excellent adhesion to said surface can be realized.

Second Embodiment

According to a second embodiment, a pattern forming method is provided. The pattern forming method includes:

forming a composition on a surface of a processing target, the surface including a portion containing a compound including Si and O and a metal-containing portion (hereinafter referred to as "step A"); forming a second composition on said composition, the second composition including Si and O (hereinafter referred to as "step B"); sandwiching the second composition between a template and the processing target (hereinafter referred to as "step C"); and curing the second composition through light irradiation in the state where the second composition is sandwiched between the template and the processing target (hereinafter referred to as "step D"). For example, the composition may be the composition of the first embodiment. Each of the steps will be described below.

(Step A)

The portion containing the compound including Si and O can be formed by, for example, an imprint method. According to the imprint method, a template of an original plate can be transferred into a target object. Thus, the portion containing the compound including Si and O may have a desired pattern shape. For example, the imprint method may be a method in which a template having, formed therein, a pattern to be transferred into a target object, is pressed against a layer of an imprint material formed by application which is then cured, thereby ensuring the transference of a pattern into the imprint material. The metal-containing portion is formed by, for example, sputtering or vapor-depositing metal onto the imprint material having a pattern transferred thereinto. Examples of the metal are those described in the first embodiment. A pattern formed in the template may be a pattern of either the nanometer or micrometer order. The width of the line may be, for example, 10 nm to 50 nm.

Examples of a method of applying the imprint material onto a processing target substrate include a spin coat method and an inkjet method. While the spin coat method can improve the throughput, the imprint material is a viscous liquid until irradiated with light.

The imprint material may include Si and O and have a low relative permittivity k, and a preferred range of the relative permittivity k is 4.0 or less. Examples of a compound satisfying said relative permittivity include a silsesquioxane-containing polymer, a polymer containing a derivative thereof, and a Si oxide. For example, the imprint material is cured when curing energy is applied thereto. As the curing energy, electromagnetic waves, heat, or the like may be used. For example, the electromagnetic waves may be a light having a wavelength in a range of 10 nm to 1 mm, such as an infrared light, a visible light, or an ultraviolet light. A photo-curable composition which is cured by light irradiation includes at least a polymerizable compound and a photopolymerization initiator, and may further include a non-polymerizable compound or a solvent, as necessary. The non-polymerizable compound may be at least one selected from the group consisting of a sensitizer, a hydrogen donor, an internal mold release agent, a surfactant, an antioxidant, a polymer component and the like. The details of the polymerizable compound, photopolymerization initiator, non-polymerizable compound, and solvent as the components which may be included in the photo-curable composition are as described in the first embodiment.

As the method for forming the composition on the surface including the portion containing the compound including Si and O and the metal-containing portion formed by the imprint method described above, firstly, the composition is, for example, applied to the surface. Examples of the applying method include a vapor-phase deposition method, a spin coat method, and a dip coat method.

Thereafter, the step of retaining the composition in the state of being applied to the surface of the processing target is preferably performed. The retention step can be performed by, for example, storing the composition in a constant-temperature bath in the state where the composition is applied to the surface of the processing target. The retention is performed in the atmosphere. The ambient temperature may be, for example, in a range of 20° C. to 200° C. The retention time is, for example, 1 to 60 minutes. By retaining the composition in the atmosphere of 20° C. to 200° C. for 1 to 60 minutes in the state where the composition is applied to the surface of the processing target, it is possible to bond the second reactive group of the compound of the composition to the compound including Si and O through, for example, silane coupling reaction. According to the silane coupling reaction, dehydration reaction may occur between the second reactive group and the compound including Si and O, thereby forming a covalent bond. Also, with the above retention step, it is possible to form a covalent bond between the first reactive group of the compound of the composition and the metal-containing portion. Therefore, the retention step can enhance the adhesion of the composition to the surface of the processing target.

After the retention step, cooling is preferably performed on the processing target having the composition applied thereto until the ambient temperature reaches 20° C. to 30° C.

The composition is then cured by light irradiation or the like, for example, whereby a layer of the composition is formed. The curing of the composition may be performed prior to the retention step.

(Step B)

The second composition including Si and O is applied onto the composition formed above.

Examples of the second composition include the imprint materials described in step A. A method of applying the second composition onto the above composition is, for example, as described in step A.

(Step C)

After step B, the step of sandwiching the second composition between a template and the processing target is performed. The template is not particularly limited as long as it is a light-transmitting member, and may be made of a transparent material such as glass or quartz. A pattern to be formed in the template is, for example, as described in step A.

(Step D)

Subsequently, the second composition is cured through light irradiation with the second composition being sandwiched between the template and the processing target.

After step D, the template is released from the cured second composition.

Thereafter, metal is formed in the second composition having the pattern of the template formed therein. Repeating steps A to D thereafter allows for attainment of a layered interconnect structure via the imprint method.

According to the second embodiment described above, it is possible not only to form a covalent bond between the first reactive group of the composition of the first embodiment and the metal-containing portion of the surface of the processing target, but also to form a covalent bond between the second reactive group of the composition of the first embodiment and the portion containing the compound including Si and O of the surface of the processing target through hydrolysis or dehydration reaction. Accordingly, it is possible to stack the composition of the first embodiment on the surface of the processing target.

Third Embodiment

According to a third embodiment, there is provided a semiconductor device including a substrate, an insulating layer above the substrate, a conductive layer in the insulating layer, and a first layer in contact with the insulating layer and the conductive layer and containing a composition. For example, the composition of the first embodiment is used as said composition. The first layer may be formed of a cured composition. In the first layer, the compound of the embodiment in the composition may exist as a unit constituting a polymer or exist alone. Examples of the polymer include an oligomer. The first layer may be an adhesion layer that provides on each of the insulating layer and the conductive layer.

The compound in the first layer can be identified by, for example, the same method as described in the first embodiment.

The composition contained in the first layer may be a polymer including the compound of the embodiment. The polymer may be an oligomer. Examples of the polymer include a polymer of the first compound having a structure represented by the chemical formula 1 and a polymer of the second compound having a structure represented by the chemical formula 2.

Examples of the polymer of the first compound having a structure represented by the chemical formula 1 are shown in a chemical formula I below.

[Chemical Formula I]

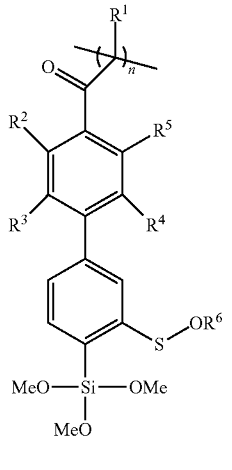

Examples of the polymer of the second compound having a structure represented by the chemical formula 2 are shown in a chemical formula II below.

[Chemical Formula II]

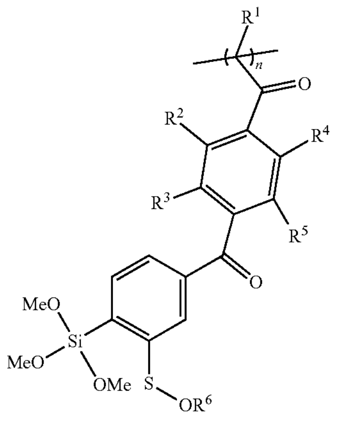

In both the chemical formula I and the chemical formula II, $R^1$ and $R^6$ are each a hydrogen atom or a methyl group, and may be the same or different; $R^2$ to $R^5$ are each selected from the group consisting of a hydrogen atom, a fluorine atom, a chlorine atom, a bromine atom, and an iodine atom; $R^2$ to $R^5$ may be the same or different; Me is a methyl group; n may be any number provided it is a natural number of 2 or more, but may be in a range of 2 to 10000.

Next, the substrate, the insulating layer, and the conductive layer will be described.

The substrate is, for example, a Si substrate. Examples of the Si substrate include a semiconductor wafer.

The insulating layer contains the compound including Si and O. The details of the compound including Si and O are as described in the second embodiment.

The conductive layer contains metal. The details of the metal are as described in the first embodiment.

The semiconductor device may include a member other than the substrate, the insulating layer, and the conductive layer. For example, a barrier metal layer may be provided between the insulating layer and the conductive layer. The barrier metal layer may be formed of, for example, SiCN, SiOC, Ta, TaN, TiN, or the like.

The structure of the semiconductor device is not particularly limited, and may be, for example, the structure shown in FIG. 1.

FIG. 1 is a schematic view showing a cross-sectional structure of the semiconductor device according to the embodiment. As shown in FIG. 1, the semiconductor device includes a substrate 1, a plurality of interconnect layers L arranged above the upper surface of the substrate 1 along an xy plane, and a first layer 2. An interconnect layer Ln-1 (n being a natural number) is positioned above the upper surface of the substrate 1 along the xy plane. The interconnect layer Ln-1 includes an insulating layer 3, conductive plugs, interconnects, and a barrier metal layer 5. The insulating layer 3 extends along the xy plane above the upper surface of the substrate 1. The conductive plugs are provided in the insulating layer 3. The plugs extend in the z-axis direction. The interconnects are provided in the insulating layer 3, and extend along the xy plane in the insulating layer 3. One interconnect **4*b* is electrically coupled, at its bottom surface, to the upper surface of one plug 4*a*. The plugs and the interconnects constitute the conductive layer. The barrier metal layer 5 is provided between the insulating layer 3 and the plugs, and between the insulating layer 3** and the interconnects.

The interconnect layer Ln is positioned higher than the interconnect layer Ln-1 (positioned farther from the substrate 1), and includes an insulating layer 6, conductive plugs, interconnects, and a barrier metal layer 8. The insulating layer 6 is provided above the upper surface of the insulating layer 3, and extends along the xy plane. The plugs are provided in the insulating layer 6, and extend along the z-axis direction. The interconnects are provided in the insulating layer 6, and extend along the xy plane in the insulating layer 6. One interconnect 7*b* is electrically coupled, at its bottom surface, to the upper surface of one plug 7*a*. The plugs and the interconnects constitute the conductive layer. The barrier metal layer 8 is provided between the insulating layer 6 and the plugs, and between the insulating layer 6 and the interconnects.

The first layer 2 is arranged between the upper surface of the interconnect layer Ln-1 along the xy plane and the lower surface of the interconnect layer Ln along the xy plane. Either the upper surface of one plug 4*a* or the upper surface of one interconnect 4*b* of the interconnect layer Ln-1 is adhered to the lower surface of the first layer 2 along the xy plane. The upper surface of the insulating layer 3 of the interconnect layer Ln-1 is adhered to the lower surface of the first layer 2 along the xy plane. On the other hand, the bottom surface of the insulating layer 6 of the interconnect layer Ln is adhered to the upper surface of the first layer 2 along the xy plane. Also, the first layer 2 has at least one through-hole extending along the z-axis direction. One plug 7*a* of the interconnect layer Ln extends inside the insulating layer 6 along the z-axis direction to reach the through-hole of the first layer 2, and the bottom surface of the plug 7*a* is electrically coupled to the upper surface of one interconnect 4*b* of the interconnect layer Ln-1. This structure is called a "dual damascene structure". The barrier metal layer 8 is arranged between an inner peripheral surface of the through-hole and the plug.

Since the first layer 2 is less likely to react with metals such as Cu and Al and is, in effect, formed of an organic compound polymer, the first layer 2 is less likely to have pores and the like and often does not have a fast diffusion pathway. Therefore, the first layer 2 may also function as a diffusion-preventing layer.

Another interconnect layer L (not shown) between the substrate 1 and the interconnect layer Ln-1 and another interconnect layer L (not shown) above the interconnect layer Ln may have the same structure as that of the interconnect layer Ln or the interconnect layer Ln-1.

An example of a method for manufacturing the semiconductor device shown in FIG. 1 will be described with reference to FIGS. 2 to 10.

Figure 2:
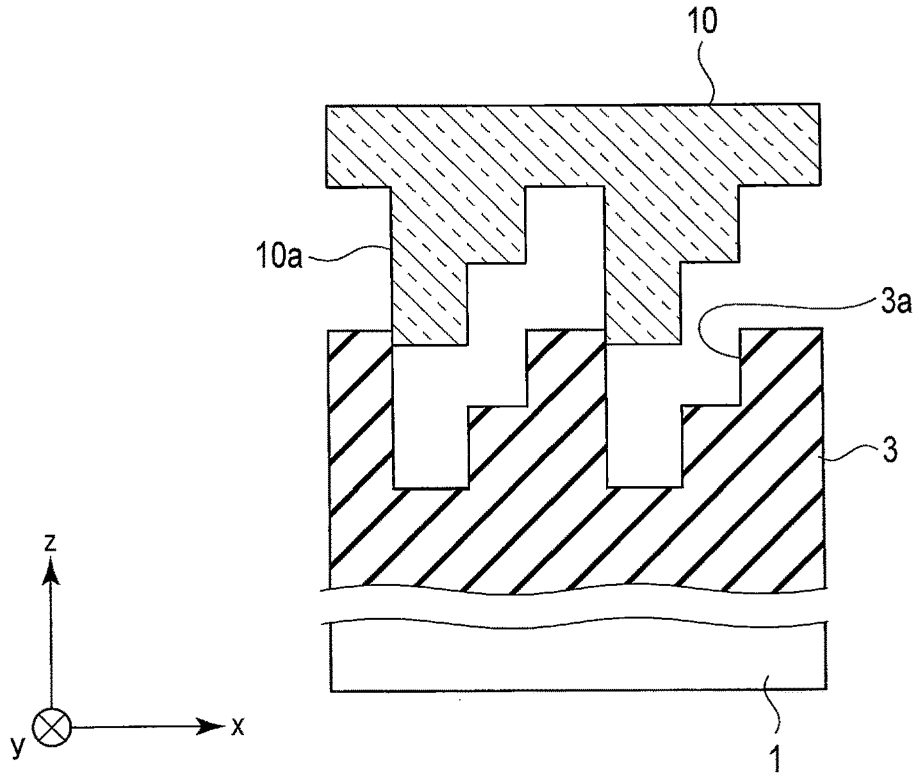
FIG. 2 is a schematic view showing a step in a method for manufacturing the semiconductor device according to the embodiment.

As shown in FIG. 2, a layer of an imprint material is arranged above the substrate 1 by application, and a pattern 10*a* is transferred into the layer of an imprint material via an imprint method using a template 10 having a desired pattern 10*a*, to form the insulating layer 3 having a desired pattern 3*a*.

Figure 3:
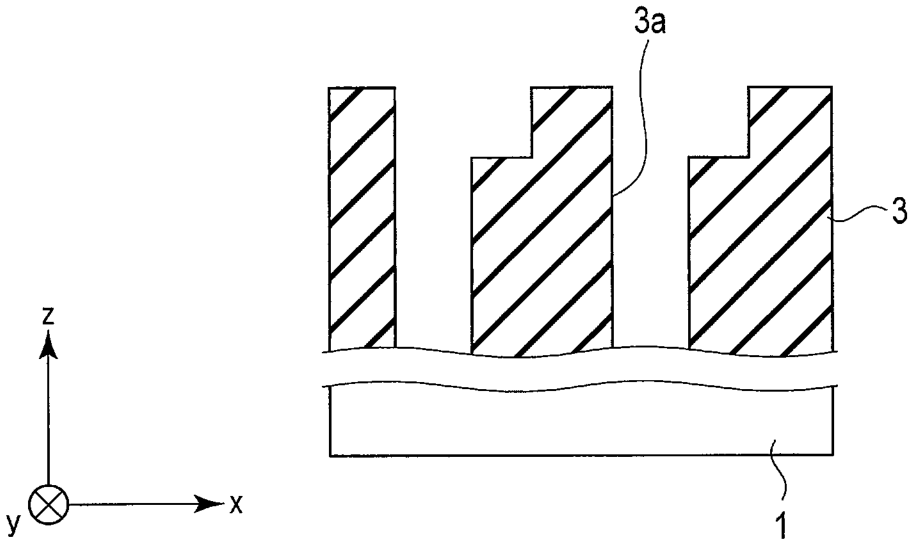
FIG. 3 is a schematic view showing a step in the method for manufacturing the semiconductor device according to the embodiment.

As shown in FIG. 3, a bottom portion defining a recessed portion of the pattern 3*a* of the insulating layer 3 that is to become a plug is removed by, for example, reactive ion etching (RIE) using 02, to form a through-hole.

Figure 4:
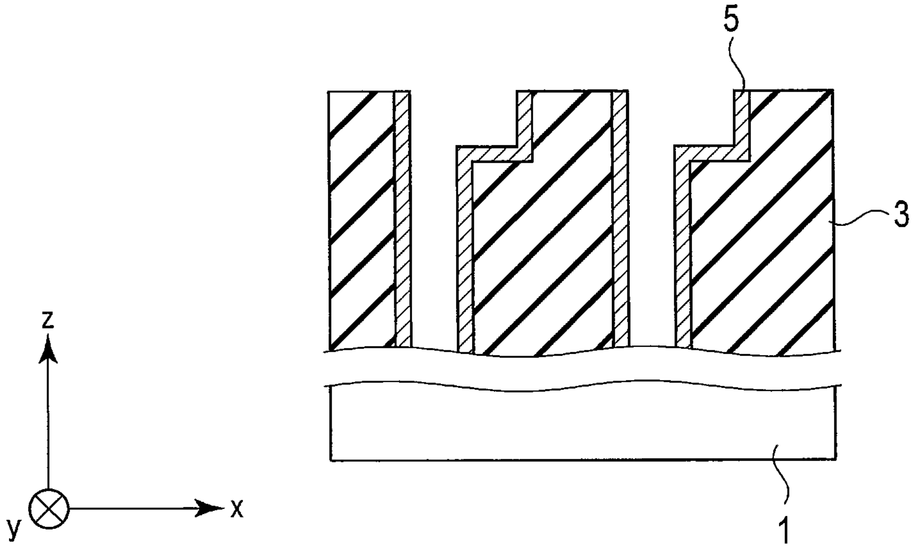
FIG. 4 is a schematic view showing a step in the method for manufacturing the semiconductor device according to the embodiment.

Next, the barrier metal layer 5 is formed on the inner surface of the recessed portion of the pattern 3*a* of the insulating layer 3 that is to become a plug or an interconnect as well as on the inner surface of the through-hole that is to become a plug or an interconnect, as shown in FIG. 4.

Figure 5:
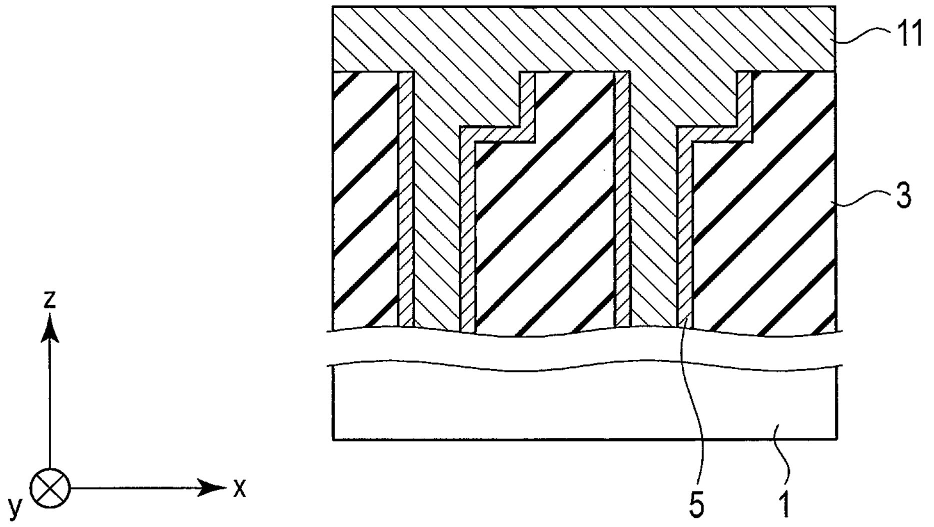
FIG. 5 is a schematic view showing a step in the method for manufacturing the semiconductor device according to the embodiment.

As shown in FIG. 5, a conductive material 11 is embedded in the recessed portion of the pattern 3*a* of the insulating layer 3 as well as in the through-hole through sputtering or vapor-deposition. Thereby, the plug 4*a* and the interconnect 4*b* are formed in the insulating layer 3.

Figure 6:
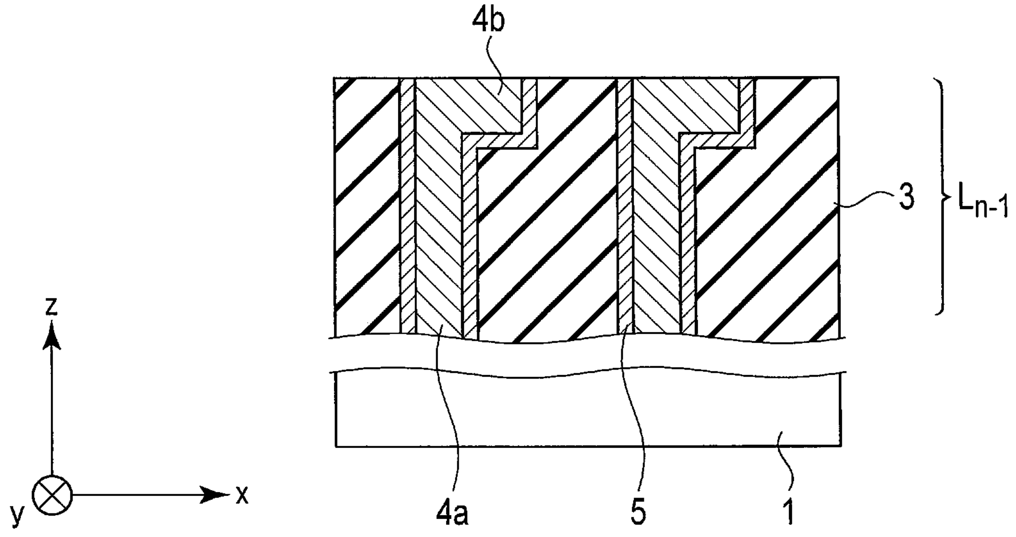
FIG. 6 is a schematic view showing a step in the method for manufacturing the semiconductor device according to the embodiment.

Next, a chemical mechanical polishing (CMP) treatment is performed on the surface, to thereby obtain the interconnect layer Ln-1, as shown in FIG. 6.

Figure 7:
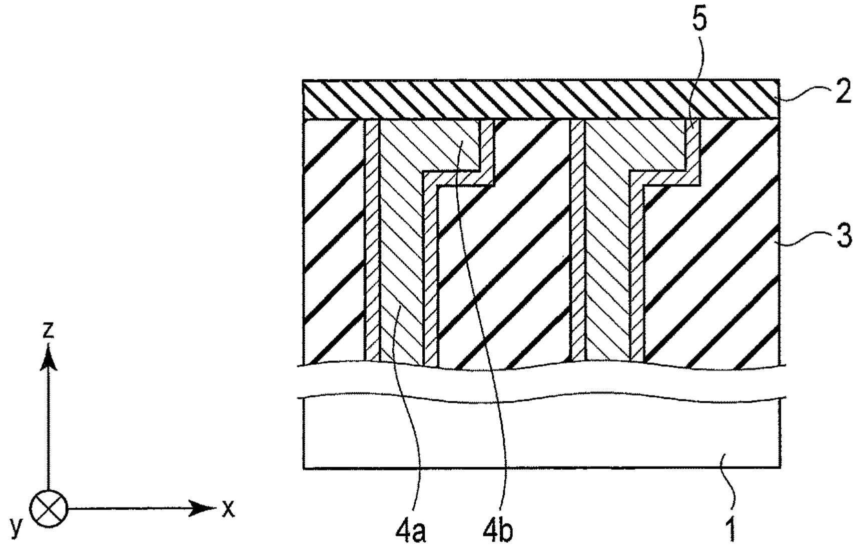
FIG. 7 is a schematic view showing a step in the method for manufacturing the semiconductor device according to the embodiment.

Then, the first layer 2 is formed on the surface of the interconnect layer Ln-1 along the xy plane by performing step A of the method of the second embodiment, as shown in FIG. 7.

Figure 8:
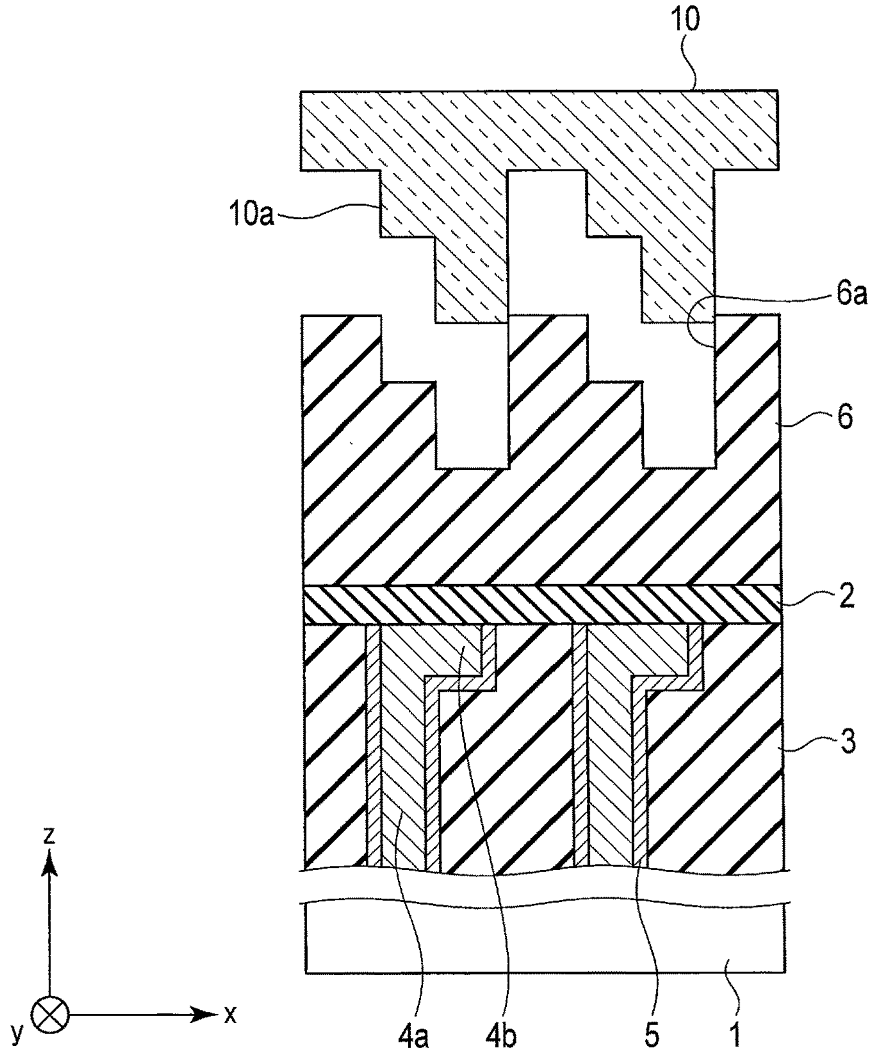
FIG. 8 is a schematic view showing a step in the method for manufacturing the semiconductor device according to the embodiment.

Next, an imprint material is applied onto the first layer 2, and then sandwiched between the template 10 having the desired pattern 10*a* and the substrate 1. The imprint material is cured by light irradiation in the state where the imprint material is sandwiched between the template 10 and the substrate 1. Thereby, the pattern 10*a* is transferred into the layer of the imprint material, and the insulating layer 6 having a desired pattern 6*a* is formed, as shown in FIG. 8. For example, the process from the application to the curing of the imprint material can be performed through steps B to D of the method of the second embodiment.

Figure 9:
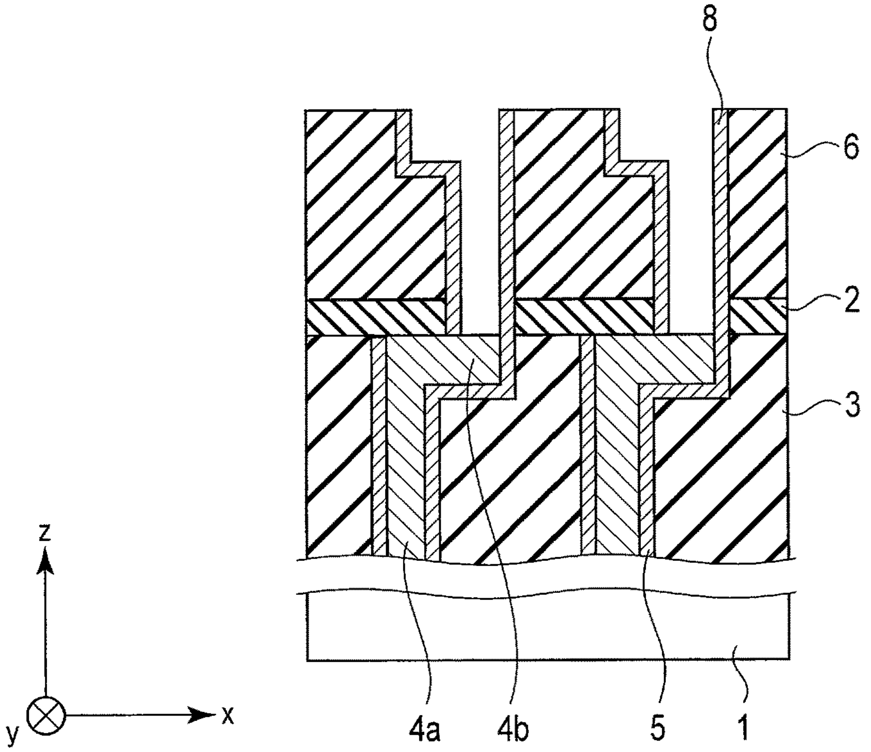
FIG. 9 is a schematic view showing a step in the method for manufacturing the semiconductor device according to the embodiment.

As shown in FIG. 9, a bottom portion defining a recessed portion of the pattern 6*a* of the insulating layer 6 that is to become a plug, and a portion of the first layer 2 that is in contact with this bottom portion are removed by, for example, reactive ion etching using 02, to form a through-hole. Next, the barrier metal layer 8 is formed on the inner surface of the recessed portion of the pattern 6*a* of the insulating layer 6 that is to become a plug or an interconnect as well as on the inner surface of the through-hole that is to become a plug or an interconnect.

Figure 10:
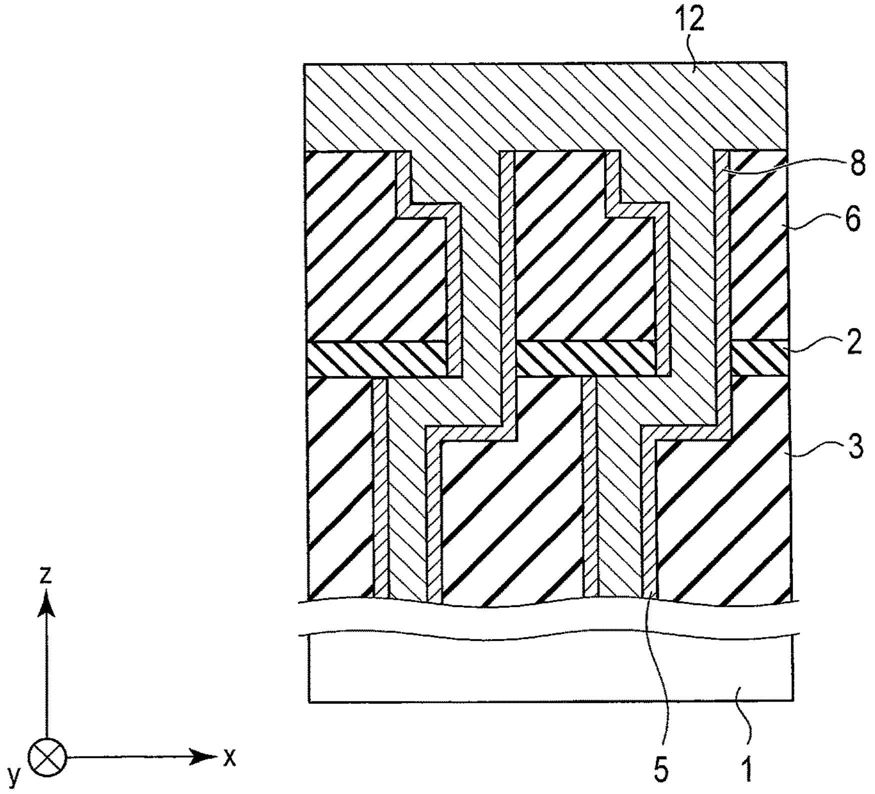
FIG. 10 is a schematic view showing a step in the method for manufacturing the semiconductor device according to the embodiment.

As shown in FIG. 10, a conductive material 12 is embedded in the recessed portion of the pattern 6*a* of the insulating layer 6 as well as in the through-hole by sputtering or vapor-deposition. Thereby, a plug and an interconnect are formed in the insulating layer 6.

Thereafter, a chemical mechanical polishing (CMP) treatment is performed on the surface, to thereby obtain the second interconnect layer Ln. As described above, the semiconductor device can be manufactured by a dual damascene method using imprint technology. The manufacturing method described with reference to the figures may be applied to an interconnect layer L other than the interconnect layer Ln-1 and the interconnect layer Ln.

Also, according to the third embodiment, a method for manufacturing a semiconductor device including a substrate provided with a plurality of semiconductor elements can be provided. Said method includes: forming the composition of the embodiment on a surface of a substrate having a film formed thereon, the surface including a portion containing a compound including Si and O and a metal-containing portion;

forming a second composition on said composition, the second composition including Si and O;

sandwiching the second composition between the substrate and a template having a pattern;

curing the second composition through light irradiation with the second composition being sandwiched between the template and the substrate; and releasing the template from the cured second composition and forming the pattern in the cured second composition; and forming an interconnect in the pattern of the cured second composition, the interconnect electrically coupling the semiconductor elements.

The substrate may be, for example, a semiconductor substrate such as a Si substrate. A plurality of semiconductor elements are formed on the substrate. The plurality of semiconductor elements may be provided in the aforementioned film, or may be separated from the film. The plurality of semiconductor elements may be in contact with the portion containing a compound including Si and O or the metal-containing portion, or both the portion containing a compound including Si and O and the metal-containing portion. An interconnect electrically coupling the plurality of semiconductor elements are formed in the pattern of the cured second composition.

Each of the steps included in the above method may be performed in the same manner as described in the first to third embodiments. According to the above method, adhesion between an upper layer and a lower layer can be improved. Therefore, an upper layer interconnect and a lower layer interconnect for electrically coupling the plurality of semiconductor elements can be formed by the imprint method. FIG. 11 shows an example of a semiconductor device manufactured by the above method.

A semiconductor device 21 shown in FIG. 11 includes a substrate 23 having a plurality of semiconductor elements formed thereon. The substrate 23 may be, for example, a semiconductor substrate such as a Si substrate. A semiconductor element 22*a* is a transistor which includes a gate electrode 24*a*, a side wall spacer 25*a*, and a source and drain 26*a*. Another semiconductor element 22*b* is a transistor which includes a gate electrode 24*b*, a side wall spacer 25*b*, and a source and drain 26*b*. The gate electrodes 24*a* and 24*b* are formed on the substrate 23. The side wall spacers 25*a* and 25*b* are formed on the substrate 23. The side wall spacer 25*a* covers the gate electrode 24*a*. The side wall spacer 25*b* covers the gate electrode 24*b*. The source and drain 26*a* is formed in the substrate 23 on both sides of the gate electrode 24*a*. The source and drain 26*b* is formed in the substrate 23 on both sides of the gate electrode 24*b*.

Lower insulating layers 27*a* and 27*b* extend on the upper surface of the substrate 23 along the xy plane. The lower insulating layer 27*a* covers the semiconductor element 22*a*. The lower insulating layer 27*b* covers the semiconductor element 22*b*. A conductive first plug 28*a* and a first interconnect 29*a* are provided in the lower insulating layer 27*a*. A conductive second plug 28*b* and a second interconnect 29*b* are provided in the lower insulating layer 27*b*. The first plug 28*a* and the first interconnect 29*a* constitute a first conductive layer. The second plug 28*b* and the second interconnect 29*b* constitute a second conductive layer. The first plug 28*a* and the second plug 28*b* extend along the z-axis direction. On the other hand, the first interconnect 29*a* and the second interconnect 29*b* extend along the xy plane. The upper surface of one first plug 28*a* is electrically coupled to the bottom surface of the first interconnect 29*a*, and the source and drain 26*a* is electrically coupled to the lower surface of the first plug 28*a*. Thus, the source and drain 26*a* of the semiconductor element 22*a* is electrically coupled to the first interconnect 29*a*. The upper surface of one second plug 28*b* is electrically coupled to the bottom surface of the second interconnect 29*b*, and the source and drain 26*b* is electrically coupled to the lower surface of the second plug 28*b*. Thus, the source and drain 26*b* of the semiconductor element 22*b* is electrically coupled to the second interconnect 29*b*.

A first layer 30 is formed on the upper surfaces of the lower insulating layers 27*a* and 27*b*, the first interconnect 29*a*, and the second interconnect 29*b* along the xy plane. The first layer 30 is provided with a plurality of through-holes 31 into which a plug is inserted. Upper insulating layers 32*a* and 32*b* extend on the surface of the first layer 30 along the xy plane. A conductive third plug 33*a* is provided in the upper insulating layer 32*a*. A conductive fourth plug 33*b* is provided in the upper insulating layer 32*b*. The third plug 33*a* and the fourth plug 33*b* extend along the z-axis direction. A third interconnect 34 extends along the x-axis direction and is formed in each of the upper insulating layer 32*a* and the upper insulating layer 32*b*. The third plug 33*a*, the fourth plug 33*b*, and the third interconnect 34 constitute a third conductive layer. The third interconnect 34 is electrically coupled, at its bottom surface, to the upper surface of one third plug 33*a* and the upper surface of one fourth plug 33*b*. The lower end of the third plug 33*a* is inserted into the through-hole 31 of the first layer 30 and electrically coupled to the upper surface of the first interconnect 29*a*. The lower end of the fourth plug 33*b* is inserted into the through-hole 31 of the first layer 30 and electrically coupled to the upper surface of the second interconnect 29*b*. Thus, the source and drain 26*a* of the semiconductor element 22*a* is electrically coupled to the source and drain 26*b* of the semiconductor element 22*b* via the first conductive layer, the second conductive layer, and the third conductive layer.

The components shown in FIG. 11 may be the same as those described in the first to third embodiments. A layer above the upper layer shown in FIG. 11 may be formed according to the method of the embodiment.

The semiconductor device of the third embodiment described above includes the first layer in contact with both the insulating layer and the conductive layer and containing the composition of the first embodiment. Since the first layer exhibits excellent adhesion with both the insulating layer and the conductive layer, adhesion between the upper layer and the lower layer can thereby be improved. In addition, since the first layer is, in effect, formed of an organic material and has a non-porous structure, and thus renders it difficult for metals such as Cu and Al to diffuse, the first layer can function as a diffusion-preventing layer. Furthermore, according to the third embodiment, a dual damascene method adopting imprint technology can be realized.

EXAMPLES

Examples will be shown in detail below.

Example 1

Synthesis of Compound

A compound A in an amount of 100 mg was placed in a 50 mL eggplant flask containing a magnetic stirrer, with the atmosphere inside the eggplant flask being an Ar atmosphere. Then, a compound B in an amount of 189 mg was placed in the flask, followed by the addition of 20 mL of tetrahydrofuran (THF). Me is a methyl group. While the solution was being stirred with a stirring bar, NaOMe in an amount of 31.3 mg was added, followed by addition of 8.5 mg of dichloro[1,1'-bis(diphenylphosphino)ferrocene]palladium. Heating was then performed, with stirring performed for 8 hours under reflux. Thereafter, the solution was cooled to an ambient temperature to extract ethyl acetate and evaporate the ethyl acetate, whereby a crude product was obtained. Purification was performed according to silica-gel column chromatography (using the ethyl acetate as a mobile phase), whereby a target compound C was obtained. The target compound C is an example of the compound represented by the chemical formula 1.

Chemical structural formulae of the compound A, the compound B, and the target compound C are represented by chemical formulas 3 to 5 below.

[Chemical Formula 3]

compound A

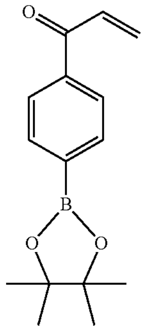

[Chemical Formula 4]

compound B

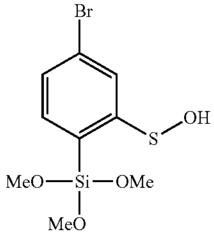

[Chemical Formula 5]

target compound C

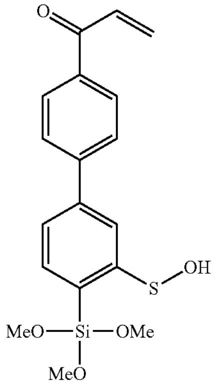

Preparation of Composition

The target compound C in an amount of 5% by mass, Irgacure (registered trademark) 819 (manufactured by BASF) in an amount of 0.1% by mass as a photopolymerization initiator, polymethacrylate in an amount of 2% by mass as a modifier, POLYFLOW No. 36 (product name of KYOEISHA CHEMICAL Co., LTD) in an amount of 0.5% by mass as a leveling agent, and PGMEA in an amount of 92.4% by mass as a solvent were mixed together to obtain a composition. The content of the target compound C and the content of the photopolymerization initiator in the composition excluding the solvent was 66% by mass and 1.3% by mass, respectively. The target compound C also served as a polymerizable compound.

Example 2

Synthesis of Compound

A compound D in an amount of 100 mg was placed in a 50 mL eggplant flask containing a magnetic stirrer, with the atmosphere inside the eggplant flask being an Ar atmosphere. Then, 1.7 equivalent of the compound B was placed in the flask, followed by the addition of 20 mL of THF. While the solution was being stirred with a stirring bar, 1.5 equivalent of $K_3PO_4$ was added, followed by the addition of 2.5 equivalent of water. Then, 0.03 equivalent of Pd(Ir)(cinnamyl) (Cl) was added. Heating was then performed until the temperature reached 90° C., and stirring was performed for 2 hours. Thereafter, the solution was cooled to an ambient temperature to extract ethyl acetate and evaporate the ethyl acetate, whereby a crude product was obtained. Purification was performed according to silica-gel column chromatography (using the ethyl acetate as a mobile phase), whereby a target compound E was obtained. The target compound E is an example of the compound represented by the chemical formula 2. A reaction formula of the synthetic reaction is shown in a chemical formula 6. The target compound E also served as a polymerizable compound.

[Chemical Formula 6]

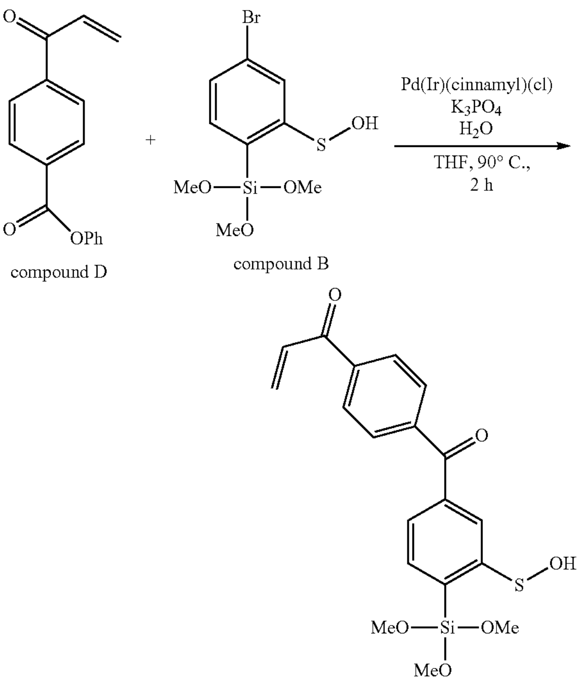

compound D compound B target compound E

Preparation of Composition

A composition was obtained in the same manner as described in Example 1 except that the target compound E was used instead of the target compound C. The content of the target compound E and the content of the photopolymerization initiator in the composition excluding the solvent was 66% by mass and 1.3% by mass, respectively.

Example 3

The composition of Example 1 was applied onto the upper surface, along the xy plane, of the interconnect layer Ln-1 of the semiconductor device shown in FIG. 1. The semiconductor device was then placed for 15 minutes in the atmosphere in a constant temperature bath adjusted to a temperature of 80° C., to perform heating. Cooling was performed thereafter at an ambient temperature for 15 minutes, and the composition was then cured through light irradiation, etc.

Next, an imprint material including a Si-containing photo-curable resin was applied onto the composition of Example 1, and the composition of Example 1 and the imprint material were subsequently sandwiched between the template 10 having the desired pattern 10*a* and the substrate 1. The imprint material was cured through exposure to light having a wavelength of 365 nm in 100 $mW/cm^2$ for 120 seconds in a nitrogen atmosphere, with the composition of Example 1 and the imprint material being sandwiched between the template 10 and the substrate 1. Thereby, the first layer and the insulating layer of the interconnect layer Ln were formed on the upper surface of the interconnect layer Ln-1.

No peeling of the insulating layer of the interconnect layer Ln from the first layer occurred. Next, the interconnect layer Ln was formed according to the steps described with reference to FIGS. 8 to 10, whereby the semiconductor device shown in FIG. 1 was manufactured. The insulating layer was formed of an organic material including Si, O, and C, and the conductive layer was formed of Cu. The first layer included a polymer represented by the chemical formula I, wherein $R^1$ to $R^6$ were a hydrogen atom.

Example 4

The composition of Example 2 was applied onto the upper surface, along the xy plane, of the interconnect layer Ln-1 of the semiconductor device shown in FIG. 1. The semiconductor device was then placed for 15 minutes in the atmosphere in a constant temperature bath adjusted to a temperature of 80° C., to perform heating. Cooling was performed thereafter at an ambient temperature for 15 minutes, and the composition was then cured through light irradiation, etc.

Next, an imprint material including a Si-containing photo-curable resin was applied onto the composition of Example 2, and the composition of Example 2 and the imprint material were then sandwiched between the template 10 having the desired pattern 10*a* and the substrate 1. The imprint material was cured through exposure to light having a wavelength of 365 nm in 100 $mW/cm^2$ for 120 seconds in a nitrogen atmosphere, with the composition of Example 2 and the imprint material being sandwiched between the template 10 and the substrate 1. Thereby, the first layer and the insulating layer of the interconnect layer Ln were formed on the upper surface of the interconnect layer Ln-1.

No peeling of the insulating layer of the interconnect layer Ln from the first layer occurred. Next, the interconnect layer Ln was formed according to the steps described with reference to FIGS. 8 to 10, whereby the semiconductor device shown in FIG. 1 was manufactured. The insulating layer was formed of an organic material including Si, O, and C, and the conductive layer was formed of Cu. The first layer included a polymer represented by the chemical II, wherein $R^1$ to $R^6$ were a hydrogen atom.

COMPARATIVE EXAMPLE

Instead of the first layer, a diffusion-preventing layer made of SiCN was formed on the upper surface, along the xy plane, of the interconnect layer Ln-1 of the semiconductor device shown in FIG. 1. Next, the insulating layer of the interconnect layer Ln was formed on the diffusion-preventing layer via an imprint method, in which instance the insulating layer did not adhere to and thus peeled off the diffusion-preventing layer, rendering it therefore impossible to stack an upper layer.

Among compounds represented by the chemical formula 1, those other than the compound of Example 1 have a structure and an electron state almost equivalent to those of the compound of Example 1, and can thus be synthesized by a method similar to that of Example 1 and can be expected to exhibit the effect shown in Example 3. Among compounds represented by the chemical formula 2, those other than the compound of Example 2 have a structure and an electron state almost equivalent to those of the compound of Example 2, and can thus be synthesized via a method similar to that of Example 2 and can be expected to exhibit the effect shown in Example 4.

According to the embodiment and the examples described above, a composition including a compound is provided. The compound includes a linking group containing 2 to 18 carbon atoms, a polymerizable functional group bonded to the linking group, a first reactive group bonded to the linking group, and a second reactive group bonded to the linking group. The polymerizable functional group includes at least one of a (meth)acryloyl group or a vinyl group. The first reactive group includes at least one selected from the group consisting of a thiol group, a disulfide group, and a thiocyanate group. The second reactive group includes at least one selected from the group consisting of an alkoxysilane group, a chlorosilane group, and a hydroxyl group. As a result, a composition achieving excellent adhesion to a composite surface containing a compound including Si and O and metal can be provided.

Embodiments are described as supplemental below.

According to an embodiment, a composition including a compound is provided. The compound includes a linking group containing 2 to 18 carbon atoms, a polymerizable functional group bonded to the linking group and capable of forming a covalent bond with a photo-curable resin through radical reaction; a first reactive group bonded to the linking group and capable of forming a covalent bond with a metal atom; and a second reactive group bonded to the linking group and capable of forming a covalent bond with a compound including Si and O through hydrolysis or dehydration reaction.

According to an embodiment, there is provided a semiconductor device including:

- a substrate;
- an insulating layer provided above the substrate and containing a compound including Si and O;
- a conductive layer provided in the insulating layer; and
- a first layer in contact with the insulating layer and the conductive layer and containing the composition of the embodiment.

In addition, according to an embodiment, there is provided a pattern forming method including: forming the composition of the embodiment on a surface of a substrate, the surface including a portion containing a compound including Si and O and a metal-containing portion;

- forming a second composition on said composition, the second composition including Si;
- sandwiching the second composition between a template and the substrate; and
- curing the second composition through light irradiation with the second composition being sandwiched between the template and the substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A composition comprising a compound, the compound comprising:

a linking group comprising 2 to 18 carbon atoms;

a polymerizable functional group bonded to the linking group;

a first reactive group bonded to the linking group; and a second reactive group bonded to the linking group, wherein:

the polymerizable functional group includes at least one of a (meth)acryloyl group or a vinyl group, the first reactive group includes at least one selected from the group consisting of a disulfide group and a thiocyanate group, and the second reactive group includes at least one selected from the group consisting of an alkoxysilane group and a chlorosilane group.

2. The composition according to claim 1, wherein the polymerizable functional group is capable of forming a covalent bond through photoradical reaction.

3. The composition according to claim 1, wherein the first reactive group is capable of forming a covalent bond with a metal atom.

4. The composition according to claim 1, wherein the second reactive group is capable of forming a covalent bond with a compound comprising Si and O through hydrolysis or dehydration reaction.

5. The composition according to claim 1, further comprising a solvent.

6. A composition comprising at least one of a compound represented by a chemical formula 1 below or a compound represented by a chemical formula 2 below,

[Chemical Formula 1]

(1)

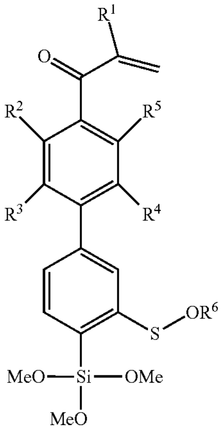

-continued

[Chemical Formula 2]

(2)

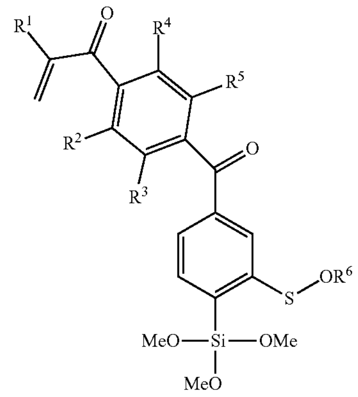

wherein, in each of the chemical formula 1 and the chemical formula 2, $R^1$ and $R^6$ are each a hydrogen atom or a methyl group, $R^1$ and $R^6$ may be the same or different, $R^2$ to $R^5$ are each selected from the group consisting of a hydrogen atom, a fluorine atom, a chlorine atom, a bromine atom, and an iodine atom, and $R^2$ to $R^5$ may be the same or different.

7. A semiconductor device, comprising:

a substrate;

an insulating layer provided above the substrate and comprising a compound comprising Si and O;

a conductive layer provided in the insulating layer, and a first layer in contact with the insulating layer and the conductive layer and comprising the composition according to claim 1.

8. The semiconductor device according to claim 7, wherein the polymerizable functional group of the composition of the first layer is capable of forming a covalent bond through photoradical reaction.

9. The semiconductor device according to claim 7, wherein the first reactive group of the composition of the first layer is capable of forming a covalent bond with a metal atom.

10. The semiconductor device according to claim 7, wherein the second reactive group of the composition of the first layer is capable of forming a covalent bond with a compound comprising Si and O through hydrolysis or dehydration reaction.

11. A pattern forming method, comprising:

forming the composition according to claim 1 on a surface of a processing target, the surface comprising a portion containing a compound comprising Si and O and a metal-containing portion;

forming a second composition on said composition, the second composition comprising Si and O;

sandwiching the second composition between a template and the processing target;

curing the second composition through light irradiation with the second composition being sandwiched between the template and the processing target; and releasing the template from the cured second composition.

12. The method according to claim 11, wherein the polymerizable functional group of the composition is capable of forming a covalent bond through photoradical reaction.

13. The method according to claim 11, wherein the first reactive group of the composition is capable of forming a covalent bond with a metal atom.

14. The method according to claim 11, wherein the second reactive group of the composition is capable of forming a covalent bond with a compound comprising Si and O through hydrolysis or dehydration reaction.

15. The method according to claim 11, wherein the composition further comprises a solvent.

16. The method according to claim 11, wherein the second composition comprises a photo-curable resin.

17. A method for manufacturing a semiconductor device, the method comprising:

forming the composition according to claim 1 on a surface of a substrate having semiconductor elements formed thereon, the surface comprising a portion containing a compound comprising Si and O and a metal-containing portion, and the substrate being a semiconductor substrate;

forming a second composition on the composition, the second composition comprising Si and O;

sandwiching the second composition between the substrate and a template having a pattern;

curing the second composition through light irradiation with the second composition being sandwiched between the template and the substrate;

releasing the template from the cured second composition and forming the pattern in the cured second composition; and forming an interconnect in the pattern of the cured second composition, and the interconnect electrically coupling the semiconductor elements.

18. A semiconductor device, comprising:

a substrate;

an insulating layer provided above the substrate and comprising a compound comprising Si and O;

a conductive layer provided in the insulating layer, and a first layer in contact with the insulating layer and the conductive layer and comprising the composition according to claim 6.

19. A pattern forming method, comprising:

forming the composition according to claim 6 on a surface of a processing target, the surface comprising a portion containing a compound comprising Si and O and a metal-containing portion;

forming a second composition on said composition, the second composition comprising Si and O;

sandwiching the second composition between a template and the processing target;

curing the second composition through light irradiation with the second composition being sandwiched between the template and the processing target; and releasing the template from the cured second composition.

20. The composition according to claim 1, wherein the polymerizable functional group is a vinyl group.

* * * * *